United States Patent
Hong

[19]

[11] Patent Number: 6,087,218
[45] Date of Patent: Jul. 11, 2000

[54] METHOD FOR MANUFACTURING DRAM CAPACITOR

[75] Inventor: Gary Hong, Hsinchu, Taiwan

[73] Assignee: United Semiconductor Corp., Hsin-Chu, Taiwan

[21] Appl. No.: 09/054,836

[22] Filed: Apr. 3, 1998

[30] Foreign Application Priority Data

Dec. 12, 1997 [TW] Taiwan .................................. 86118765

[51] Int. Cl.$^7$ ............................................. H01L 21/8242
[52] U.S. Cl. ........................................... 438/255; 438/657
[58] Field of Search ..................................... 438/253, 255, 438/396, 398, 634, 657, 665, 964

[56] References Cited

U.S. PATENT DOCUMENTS

| | | | |
|---|---|---|---|
| 5,741,722 | 4/1998 | Lee ........................................... | 438/253 |
| 5,759,895 | 6/1998 | Tseng ....................................... | 438/255 |
| 5,763,306 | 6/1998 | Tsai ......................................... | 438/255 |

Primary Examiner—Chandra Chaudhari
Attorney, Agent, or Firm—Christie, Parker & Hale, LLP

[57] ABSTRACT

A method for manufacturing DRAM capacitor that utilizes a self-aligned etching process for fabricating the lower electrode of a capacitor instead of a conventional photolithographic process whose processing accuracy is dependent upon the resolution of light source used. Using a polysilicon layer as a mask and a silicon nitride layer as an etching stop layer, the self-aligned etching process is carried out to form a rather narrow contact window in the insulating layer. By forming this narrow contact window, proper isolation between a word line and its neighboring conductive layer is ensured. Hence, device reliability is increased.

12 Claims, 4 Drawing Sheets

METHOD FOR MANUFACTURING DRAM CAPACITOR

CROSS-REFERENCE TO RELATED APPLICATION

This application claims the priority benefit of Taiwan application Ser. No. 86118765, filed Dec. 12, 1997, the full disclosure of which is incorporated herein by reference.

BACKGROUND OF THE INVENTION

1. Field of Invention

The present invention relates to a method for manufacturing a semiconductor capacitor. More particularly, the present invention relates to a method for manufacturing a dynamic random access memory (DRAM) capacitor.

2. Description of Related Art

FIG. 1 is an equivalent circuit diagram of a DRAM cell. A DRAM cell comprises a transfer transistor T and a storage capacitor C. The source terminal of a transfer transistor T is connected to a bit line BL, and the drain terminal is connected to a storage electrode 10 of a storage capacitor C. The gate terminal of the transfer transistor is connected to a word line WL. The opposed electrode 12 is connected to a fixed voltage source. A dielectric layer 14 is formed between the storage electrode 10 and the opposed electrode 12.

FIG. 2 is a cross-sectional view showing the basic structure of a conventional DRAM device. As shown in FIG. 2, the method of fabricating a DRAM cell comprises the step of forming a plurality of field oxide layers 21 on a P-type substrate 20. The field oxide layers 21 not only define the device regions, but also act as a device isolation structure. Thereafter, a gate oxide layer 22, a polysilicon layer 23 and an upper cap oxide layer 24 are sequentially formed over the substrate 20 forming a gate structure as shown in FIG. 2. Subsequently, protective oxide spacers 25 are formed on the sidewalls of the gate structure.

Next, a self-aligned process is used to form source/drain regions 26a and 26b in the substrate 20, thus finishing the fabrication of a MOS transistor. After that, a polysilicon layer having electrical connection with one source/drain region 26b is formed by a conventional method. The polysilicon layer acts as a bit line 27. In a subsequent step, an insulating layer 28, for example, an oxide layer, is formed over the substrate 20 and gate structure. Next, using photolithographic and etching processes, the insulating layer 28 is patterned to form a self-aligned contact window 29 exposing the source/drain region 26a. Finally, a conductive layer is deposited over insulating layer 28 and into the contact window 29, and then patterned to form the lower electrode of the capacitor.

Due to the restriction imposed by the resolution of light source in a photolithographic process, there is a minimum size for the contact window 29. If attempt is made to narrow down the contact window 29 and surrounding structures without due regard to possible errors caused by the ultimate resolution, the insulating material for isolating the gate 23 from subsequently deposited conductive layer may be too thin and may result in short-circuiting. Thus, reliability of the device is compromised.

In the meantime, the charge storage capacity of a capacitor needs to be increased. Therefore, new dielectric materials that has a higher dielectric constant or new methods that are capable of depositing a thinner and better quality dielectric layer are constantly in need. Yet, how to increase the surface area of a charge storage electrode despite the continuous shrinking of available DRAM substrate area remains to be a major issue in semiconductor fabrication.

At present, various methods for increasing the surface area of the capacitor's lower electrode are devised. Most of them make use of fabricating three-dimensional structures and forming uneven surfaces. For example, all kinds of structural shapes for the lower electrode, such as a crown, a pillar, a fin, a tree-trunk with branches or a cavity, exist. In addition, a hemispherical grained silicon (HSG-Si) layer can be formed over the surface of an electrode to increase the charge storage capacity of a capacitor by up to about 80 percent. However, the capacitance of a capacitor can still be increased by following an improved method of manufacturing.

SUMMARY OF THE INVENTION

Accordingly, the present invention is directed to provide a self-aligned processing method that is free from the limitations imposed by the resolution of light source. Furthermore, a silicon nitride layer is used as a mask for etching the insulating layer that lies above the word line and bit line so that a narrow contact window is formed. Therefore, the word line and the conductive layer are properly isolated from each other, and the reliability of the device is increased.

To achieve these and other advantages and in accordance with the purpose of the invention, as embodied and broadly described herein, the invention provides a method for manufacturing DRAM capacitor. First, a semiconductor substrate having at least one MOS transistor formed thereon is provided. The MOS transistor has a gate that acts as a word line and source/drain terminals in the substrate on each side of the gate terminal. The polysilicon layer between the transistor gates is patterned to act as a bit line, and the bit line is electrically coupled to one source/drain terminal of the MOS transistor. The method of manufacturing a DRAM capacitor comprises the steps of forming an insulating layer over the substrate covering both the word line and bit line, then sequentially forming a mask layer, a first oxide layer and a first polysilicon layer over the insulating layer. Subsequently, an opening is formed in the first polysilicon layer. The opening is located right above one of the source/drain regions. Thereafter, a second oxide layer is deposited over the first polysilicon layer and into the opening. The second oxide layer forms a groove above the opening.

Next, a self-aligned etching process is performed to etch away the second oxide layer and a portion of the mask layer, the first oxide layer and the insulating layer forming a contact window in the insulating layer. After that, a second polysilicon layer is deposited over the first polysilicon layer, completely filled the contact window and electrically coupled to one of the source/drain region. Thereafter, the first and the second polysilicon layers are patterned, and then the first oxide layer is removed. The first polysilicon layer and the second polysilicon layer together constitute a lower electrode of the capacitor. Finally, a dielectric layer is formed over the second polysilicon layer, and then a third polysilicon layer, which acts as the upper electrode of a capacitor, is formed above the dielectric layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
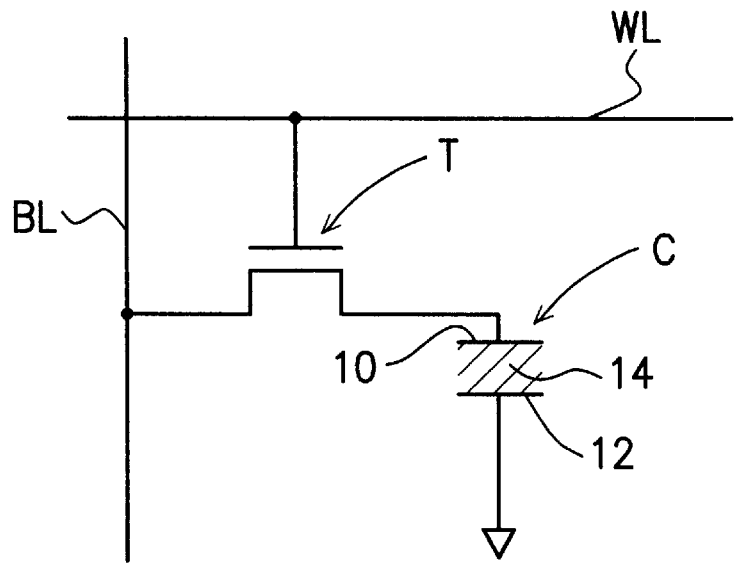
FIG. 1 is an equivalent circuit diagram of a DRAM unit.
Figure 2:
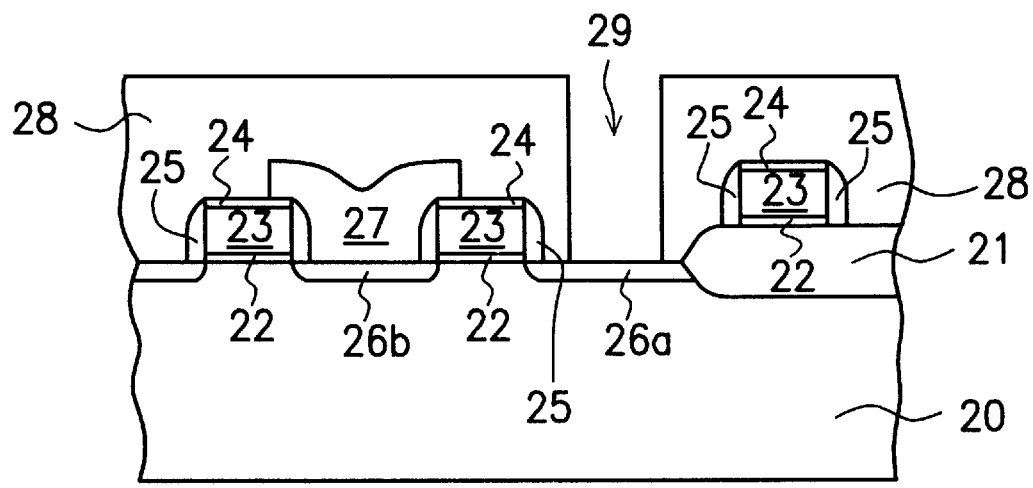
FIG. 2 is a cross-sectional view showing the structure of a conventional DRAM device.

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3G are cross-sectional views showing the progression of manufacturing steps in producing a DRAM capacitor according to one preferred embodiment of this invention.

Figure 3A:
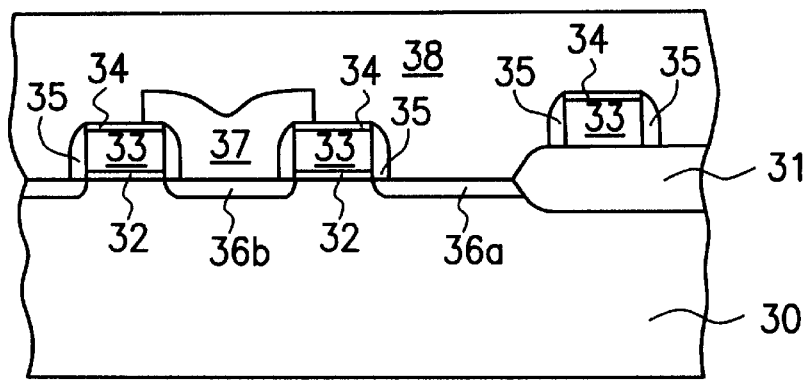
FIGS. 3A through 3G are cross-sectional views showing the progression of manufacturing steps in producing a DRAM capacitor according to one preferred embodiment of this invention.

First, as shown in FIG. 3A, a device isolation structure 31 is formed on the surface of a silicon substrate 30. For example, a thermal oxidation method is used to oxidize the silicon (using a LOCOS technique) forming a field oxide layer preferably having a thickness of about 3000 Å. Alternatively, a shallow trench can be used as a device isolation structure. Next, the substrate 30 is place inside a furnace, and then a dry thermal oxidation method is used to form a gate oxide layer 32 for protecting the substrate against damages in subsequent processes.

The gate oxide layer 32 can be a silicon dioxide layer preferably having a thickness of about 100 Å to 250 Å. Thereafter, a polysilicon layer 33 preferably having a thickness of about 2000 Å to 3000 Å is formed over the gate oxide layer 32 using, for example, a low-pressure chemical vapor deposition (LPCVD) method. In addition, a heat-diffusion method or an ion implantation method can be used to implant impurities into the polysilicon layer 33 to increase its conductivity. Thereafter, a cap oxide layer 34 is deposited over the polysilicon layer 33. Then, photolithographic and etching processes are used to pattern the cap oxide layer 34, the polysilicon layer 33 and the gate oxide layer 32 to form the gate structure of the MOS device.

Next, a blanket oxide layer is formed over the substrate using a chemical vapor deposition method, where the thickness of desired spacers 35 is determined by the thickness of this blanket oxide layer. In a subsequent step, the blanket oxide layer is anisotropically etched back to form spacers 35 using, for example, a plasma etching method with carbon tetrafluoride ($CF_4$) or other fluoride compound as the gaseous source.

The cap oxide layer 34 and the oxide spacers 35 isolate the polysilicon gate layer 33 and avoid unwanted contact with subsequently deposited conductive layer. Thereafter, an oxide spacer self-aligned process is used to implant ions into the substrate 30 to form the source/drain regions 36a and 36b of the MOS transistor. The implanted ions preferably have a concentration level of about $10^{15}/cm^2$. Alternatively, a gate sidewall self-aligned process is used to carry out a first light concentration ion implant to form a lightly doped region in the substrate 30 before the formation of the oxide spacers 35, and then a second high concentration ion implant is performed after the formation of the oxide spacers 35 to establish a lightly doped drain (LDD) structure in the substrate 30.

Next, using conventional techniques, a polysilicon layer electrically coupled with a source/drain region 36b and acting as a bit line 37 is formed between the gate structures. Thereafter, a chemical vapor deposition (CVD) method is used to deposit a planarized insulating layer 38 over the substrate 30, the word line 33 and the bit line 37. For example, an atmospheric-pressure chemical vapor deposition (APCVD) or a plasma-enhanced chemical vapor deposition (PECVD) method can be used to deposit a borophosphosilicate glass (BPSG) layer having a thickness preferably between 5000 Å to 20000 Å.

This is followed by using a heat reflow or a chemical-mechanical polishing method to planarize the BPSG layer. After planarization, subsequently formed layers over the insulating layer 38 will be easier to deposit in addition to having a better-deposited quality.

Figure 3B:
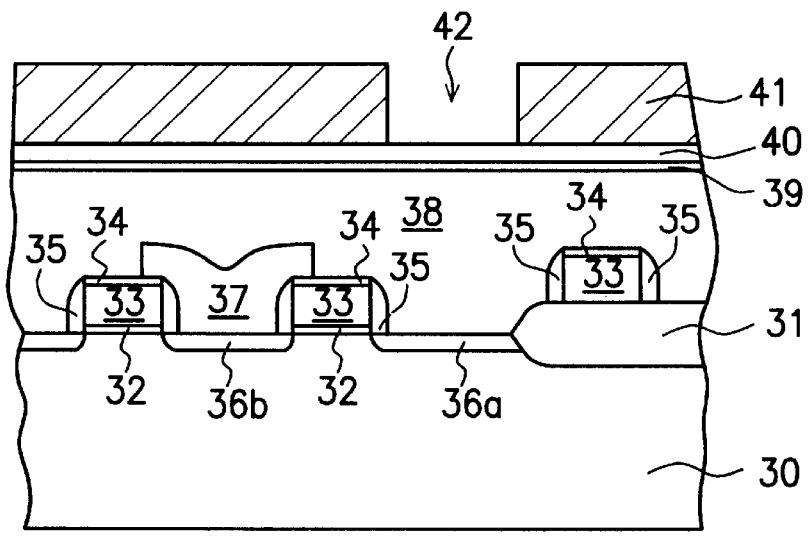

Next, as shown in FIG. 3B, a blanket mask layer 39, a first oxide layer 40 and a first polysilicon layer 41 are sequentially formed over the insulating layer 38 using, for example, a chemical vapor deposition method. The mask layer 39 can be a silicon nitride layer and preferably having a thickness of about 100 Å to 2000 Å. The first oxide layer preferably has a thickness of about 500 Å to 2000 Å. The first polysilicon layer can be impurities-doped to increase its electrical conductivity. Thereafter, through photoresist coating and photolithographic development techniques, an opening 42 located directly above one of the source/drain regions 36a is etched in the first polysilicon layer 41.

Figure 3C:
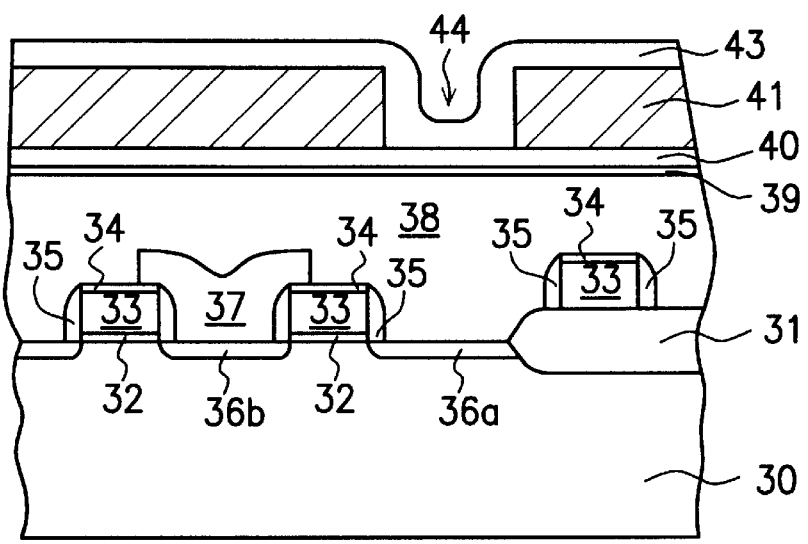
Figure 3D:
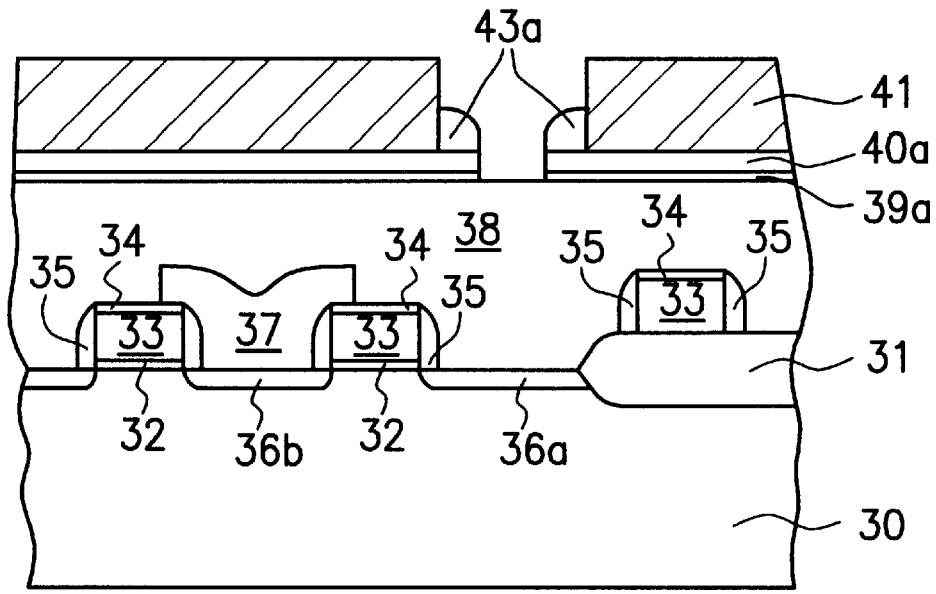

Next, as shown in FIG. 3C, a second oxide layer 43 is formed over the first polysilicon layer 41 and the opening 42 using, for example, a chemical vapor deposition method. The second oxide layer 43 preferably has a thickness of about 500 Å to 5000 Å, wherein a groove 44 is formed above opening 42 rather than being completely filled in the process of deposition. Subsequently, a self-aligned etching process is performed using an anisotropic dry etching method such as a plasma etching method. First, using the dry etching method, the second oxide layer 43 above the first polysilicon layer 41 is removed forming spacer-like structures 43a on the sidewalls of the opening 42 as shown in FIG. 3D. At the same time, a portion of the first polysilicon layer 41, a portion of the first oxide layer 40a and a portion of the mask layer 39a in the groove 44 are removed exposing a portion of the insulating layer 38. As dry etching continues, the spacer-like structures 43a and the portion of first oxide layer 40a underneath will be removed, only stopping when the mask layer 39a is reached.

Figure 3E:
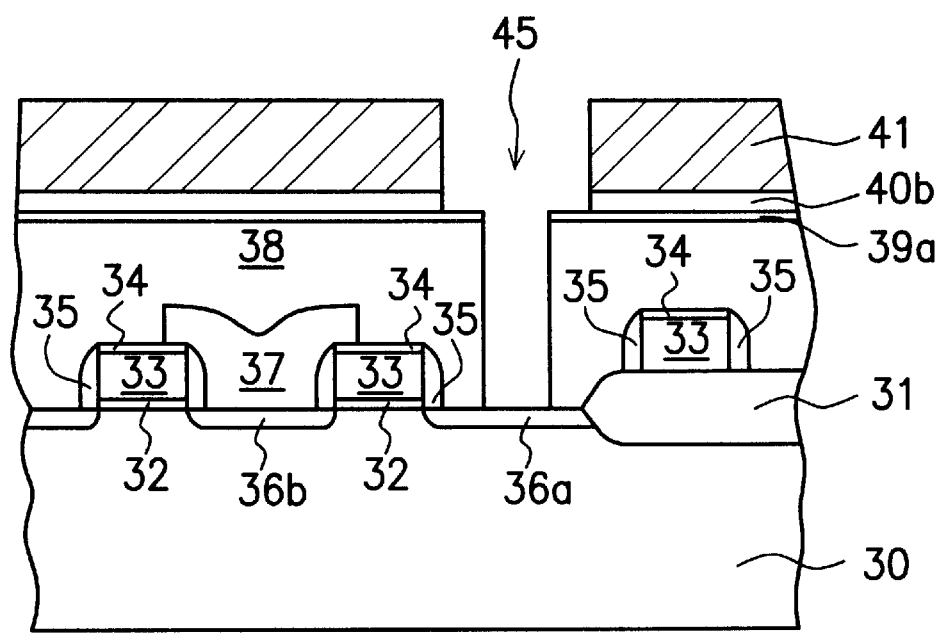

In the meantime, a portion of the insulating layer 38 will also be etched away, and hence forming a contact window 45 leading from the top to the source/drain region 36a of the substrate 30 as shown in FIG. 3E. Since the width at the lower part of the contact window 45 depends on the width of the groove 44 as shown in FIG. 3C rather than on the resolution of light in a restrictive conventional photolithographic process, this invention is able to form a narrower contact hole. In other words, the lower part of the contact window 45 can be made narrower, and at the same time ensuring a minimum thickness of isolating material between the gate 33 and the subsequently formed conductive layer. Consequently, there will be no short-circuiting of the device, and the reliability will be increased.

Figure 3F:
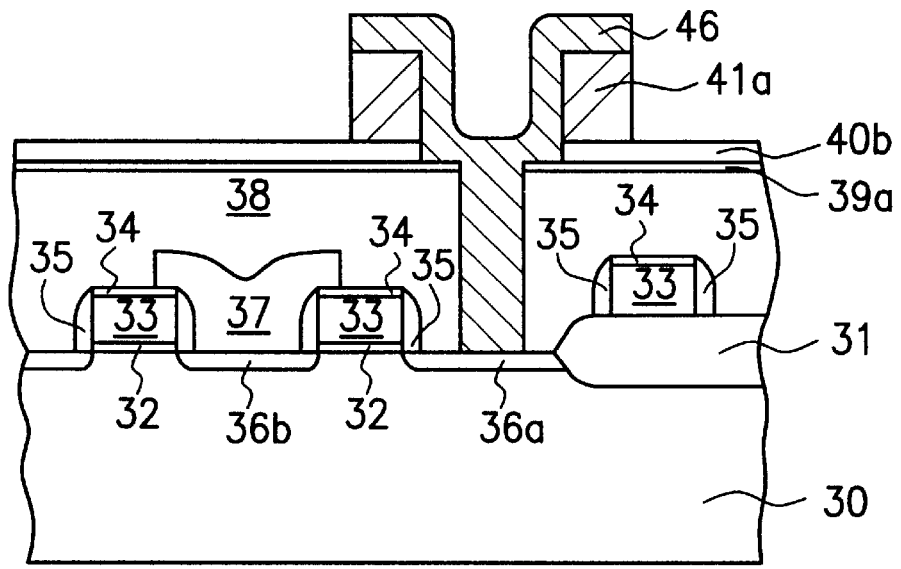

Next, an impurities-doped second polysilicon layer is formed over the sidewalls in the upper part of the contact window 45 while completely filling up the bottom part of the contact window 45. Then, the first polysilicon layer 41a and the second polysilicon layer 46 can be patterned into a structure as shown in FIG. 3F. In fact, the second polysilicon layer 46 and the first polysilicon layer 41a can be patterned into any shapes that is capable of increasing surface area, for example, a pillar, a groove, a fin or many others. Subsequently, the first oxide layer 40b is removed to form the lower electrode structure of a capacitor using, for example, hydrofluoric acid in a wet etching method.

Figure 3G:
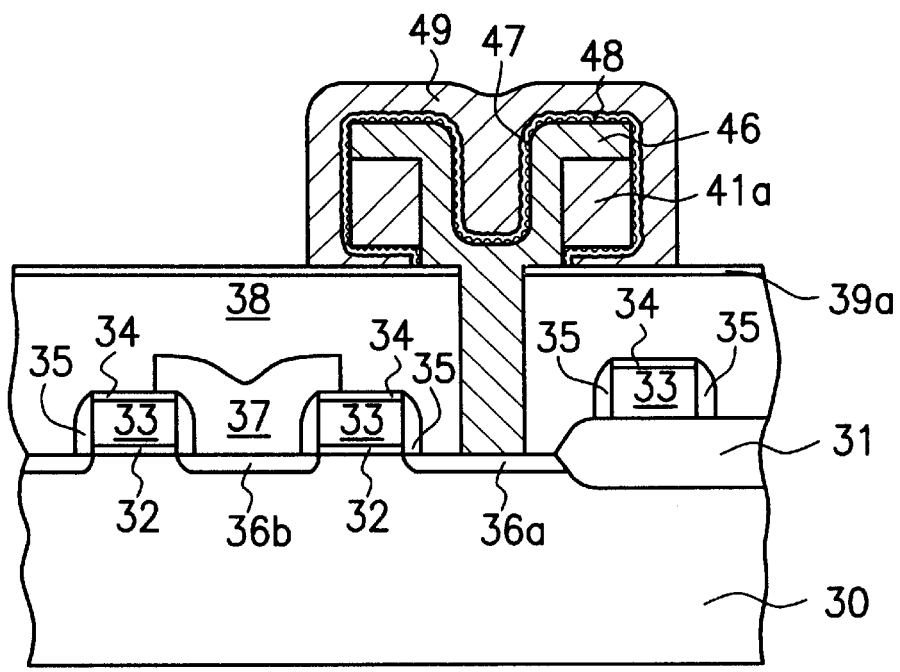

Finally, as shown in FIG. 3G, a hemispherical grained polysilicon layer 47 is formed over the second polysilicon layer 46 and the first polysilicon layer 41a. The hemispherical grained polysilicon layer 47 can be formed by any conventional methods. For example, a low-pressure chemical vapor deposition method with reacting temperature controlled between 550° C. to 595° C. and pressure set to about 0.2 to 0.5 torr can be used to deposit hemispherical grained polysilicon (HSG-Si) using silicane as a gaseous source. The deposited HSG-Si finally nucleates in the process to form a grainy surface, thereby increasing the surface area of the lower electrode.

Next, a dielectric layer 48 is formed over the hemispherical grained polysilicon layer 47. The dielectric layer 48 can be, for example, a nitride/oxide (NO) composite layer. However, the dielectric layer can also be a material having a high dielectric constant such as tantalum pentoxide ($Ta_2O_5$) or provskite dielectrics such as a barium-strontium-titanium compound. Thereafter, a third polysilicon layer 49 is formed over the dielectric layer.

The third polysilicon layer 49 acts as the upper electrode of the capacitor, and is formed, for example, by a low-pressure chemical vapor deposition method. Furthermore, impurities can be doped or ions can be implanted, and an annealing operation can be performed during deposition of the third polysilicon layer 49. After further photolithographic and patterning of the upper electrode, fabrication of the DRAM capacitor is complete.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a DRAM capacitor comprising the steps of:

providing a semiconductor substrate having at least one MOS transistor formed thereon, wherein the MOS transistor has a gate that acts as a word line and source/drain terminals in the substrate on each side of the gate terminal, and a patterned polysilicon layer between two transistor gates acting as a bit line, said bit line being electrically coupled to one source/drain terminal of the MOS transistor;

forming an insulating layer over the substrate, the word line and the bit line;

forming a mask layer, a first oxide layer and a first polysilicon layer over the insulating layer;

forming an opening in the first polysilicon layer located directly above a source/drain region;

forming a second oxide layer over the first polysilicon layer and the opening, the second oxide layer forming a groove in the opening;

using a self-aligned etching process, the second oxide layer, a portion of the mask layer, a portion of the first oxide layer and a portion of the insulating layer are etched to form a contact window in the insulting layer;

depositing a second polysilicon layer over the first polysilicon layer and into the contact window forming electrical connection with the source/drain region;

patterning the first polysilicon layer and the second polysilicon layer, then removing the first oxide layer, wherein the first polysilicon layer and the second polysilicon layer together act as a lower electrode of the capacitor; and forming a dielectric layer over the first and the second polysilicon layers, then forming a third polysilicon layer over the dielectric layer to act as an upper electrode of the capacitor.

2. The method of claim 1, wherein the mask layer acts as an etching stop layer in the self-aligned etching operation.

3. The method of claim 1, wherein after the step of patterning the first and second polysilicon layers and the removal of the oxide layer but before the step of forming the dielectric layer, further includes forming a hemispherical grained polysilicon layer over the first and the second polysilicon layer.

4. The method of claim 1, wherein the step of patterning the first and the second polysilicon layers further includes shaping the first and the second polysilicon layers into a pillar, a fin or other structures, which can increase surface area of the lower electrode.

5. The method of claim 1, wherein the step of removing the first oxide layer includes a wet etching method.

6. The method of claim 1, wherein the step of forming the insulating layer includes depositing oxide material.

7. The method of claim 1, wherein the step of removing the first oxide layer includes using hydrofluoric acid.

8. The method of claim 1, wherein the step of forming the mask layer includes depositing silicon nitride.

9. The method of claim 8, wherein the silicon nitride layer has a thickness of about 100 Å to 2000 Å.

10. The method of claim 1, wherein the insulating layer has a thickness of about 500 Å to 2000 Å.

11. The method of claim 1, wherein the second oxide layer has a thickness of about 500 Å to 5000 Å.

12. The method of claim 1, wherein the step of using the self-aligned etching process to form the contact window in the insulating layer includes an anisotropic etching method.

* * * * *